(12) United States Patent
Nguyen

(10) Patent No.: US 6,232,803 B1
(45) Date of Patent: May 15, 2001

(54) TIGHTLY CONTROLLED OUTPUT LEVEL CMOS-PECL DRIVER

(75) Inventor: Thai M. Nguyen, San Jose, CA (US)

(73) Assignee: Kabushiki Kaisha Toshiba (JP)

( * ) Notice: Subject to any disclaimer, the term of this patent is extended or adjusted under 35 U.S.C. 154(b) by 0 days.

(21) Appl. No.: 09/311,178

(22) Filed: May 13, 1999

(51) Int. Cl.$^7$ .................................................. H03K 5/22
(52) U.S. Cl. ................................................ 327/63; 326/71
(58) Field of Search .................... 326/83, 71, 63; 365/185.23; 327/538, 530, 63

(56) References Cited

U.S. PATENT DOCUMENTS

| | | | |
|---|---|---|---|
| 5,506,803 | * | 4/1996 | Jex .................................... 365/185.23 |
| 5,525,914 | * | 6/1996 | Cao et al. ................................ 326/71 |
| 5,576,656 | * | 11/1996 | McClure ................................. 327/538 |
| 5,581,209 | * | 12/1996 | McClure ................................. 327/538 |
| 5,874,209 | * | 2/1999 | Manobar et al. ........................ 326/83 |

OTHER PUBLICATIONS

See Figures 1–3 of the application.

\* cited by examiner

Primary Examiner—David Nelms
Assistant Examiner—Thong Le
(74) Attorney, Agent, or Firm—Gray Cary Ware & Freidenrich LLP

(57) ABSTRACT

A driver circuit is provided comprising a detection circuit, configured to sense a plurality of different variable operating condition signals, and in accordance therewith, provide a plurality of operating condition dependent output signals; a selection circuit, having a plurality of output signals, configured to receive said plurality of operating condition dependent output signals, and in accordance therewith, discretely enable, during a non-transmission state, an N number of enabled output signals; and an output circuit, having a plurality of identical segmented output modules, each of the output modules associated with a respective one of the plurality of output signals and configured to provide a respective output driving signal, wherein the output modules associated with the N number of enabled output signals each provide the output driving signal.

10 Claims, 8 Drawing Sheets

TIGHTLY CONTROLLED OUTPUT LEVEL CMOS-PECL DRIVER

TECHNICAL FIELD OF THE INVENTION

The present invention relates to Complementary Metal Oxide Semiconductor-Positive Emitter Coupled Logic (CMOS-PECL) drivers.

BACKGROUND OF THE INVENTION

Today's computer networks handle an ever-increasing amount of data. Fast Ethernet transmits and receives packets at rates of at least 100 Mbps., and other technologies such as asynchronous transfer mode (ATM) also require high data rates.

Very high speed applications traditionally use current-switching technologies known as emitter-coupled logic (ECL) gates and drivers.

CMOS typically operates with a power supply of 5V or 3.3V, but ECL traditionally operates with a negative power supply. Thus, standard ECL levels are not generally compatible with CMOS. A positive-voltage-shifted ECL, known as pseudo-ECL (PECL), has been used for CMOS chips using ECL-type current drivers.

ECL current drivers are often used to drive differential signals. Using a pair of signals rather than just one signal reduces sensitivity to noise and interference, since interference usually affects both signals equally, while not affecting the voltage difference between the two signals, nor the difference in current driven to each signal.

FIGS. 1 and 2 show conventional application circuits of a CMOS-PECL driver. Specifically, FIG. 1 is a schematic representation of a PECL output circuit 1 connecting with a 50Ω termination resistor 2.

The output DC levels of the circuit of FIG. 1, $V_{OL}$ and $V_{OH}$, are functions of source voltage, $V_{DD}$, electron mobility, $\mu^e$, threshold voltage, $V_T$ and temperature. Estimations from quick calculations show that the variations of both $V_{OL}$ and $V_{OH}$ are roughly equivalent to about ±600 mV. Variations on $V_{DD}$ account for about 60% of the output voltage variation and the other 40% is contributed from variations of manufacturing process specifications and temperature.

Therefore, there is a need to develop a new CMOS-PECL driver that delivers a tightly controlled output level under different operating conditions and over wide-tolerance manufacturing process specifications.

FIG. 3 is a detailed circuit diagram of the CMOS-PECL driver circuit 1. Referring to FIG. 3, the output of a phase splitter circuit 4 is connected to a plurality of NAND gates 20, a plurality of inverters 21a–c, and a plurality of FETs 22a,b. For ease of illustration, only one NAND gate 20, and one of each set of inverters 21a–c is shown. However, as illustrated in FIG. 3, the notation 10X denotes a set of 10 components of each selected minimum unit value type, and the notation 2X denotes a set of 2 components of the selected minimum value type. That is, the 2X and 10X notations in FIG. 3 are placed there to indicate the relative size of each device that can be referenced to a minimum unit device.

Therefore, in the conventional output structure, a two-input NAND gate 20 receives as its inputs, input signals A and EN. NAND gate 20 is connected in series with a first inverter 21a which is connected in series with a second inverter 21b to form a buffer. The output of the second inverter 21b is provided to the gate terminal of FET 22a. The source terminal of FET 22a is connected with voltage source $V_{DD}$.

Inverter 21c receives as its input, signal EN. The output of the inverter 21c is provided to the gate terminal of FET 22b. The source terminal of FET 22b is connected with voltage source $V_{DD}$. The drain terminals of FETs 22a,b are connected together, which provide output signal Z.

However, these conventional CMOS-PECL drivers fail to deliver a tightly controlled output level under different operating conditions and over wide-tolerance manufacturing process specifications.

Most of the known conventional circuits which attempt a solution to this problem are of the analog, feedback type. These circuits monitor and/or sense either PECL driver outputs or a dummy replica input/output (I/O) structure and then compare them with either internal and/or external preset reference voltages $V_{OL}$ and $V_{OH}$, and generate bias voltages for the actual I/O structures.

SUMMARY OF THE INVENTION

The present invention solves the problem of providing a CMOS-PECL driver that delivers a tightly controlled output level under different operating conditions and over wide-tolerance manufacturing specifications by a digital, feed-forward circuit.

The circuit is comprised of a $V_{DD}$ potential detection circuit and a combined process and temperature detection circuit. Additionally, the circuit comprises an encoder circuit and an enabler and decoder circuits as well as a segmented output circuit.

The output circuit is segmented into identical modules while implementing a power scheme that is used to shut down inactive comparators that are employed in low power DC application flash ADCs.

Briefly, the circuit generates $V_{DD}$ and process-plus-temperature dependent signals and digitally encodes the control signals from $2^n$ to N lines to reduce wiring complexity. These encoded lines may be shared with other on-chip PECL drivers. An enabling technique updates control signals only during the TX OFF (transmission off) state to avoid causing jitters and/or corruptions with transmitting signals. The N lines are then locally decoded back to the $2^n$ lines for controlling PECL output structure modules.

DETAILED DESCRIPTION OF THE PREFERRED EMBODIMENT

The present invention provides a novel CMOS-PECL driver circuit that can deliver a tightly controlled output level under different operating conditions and over wide-tolerance manufacturing process specifications.

Figure 4:
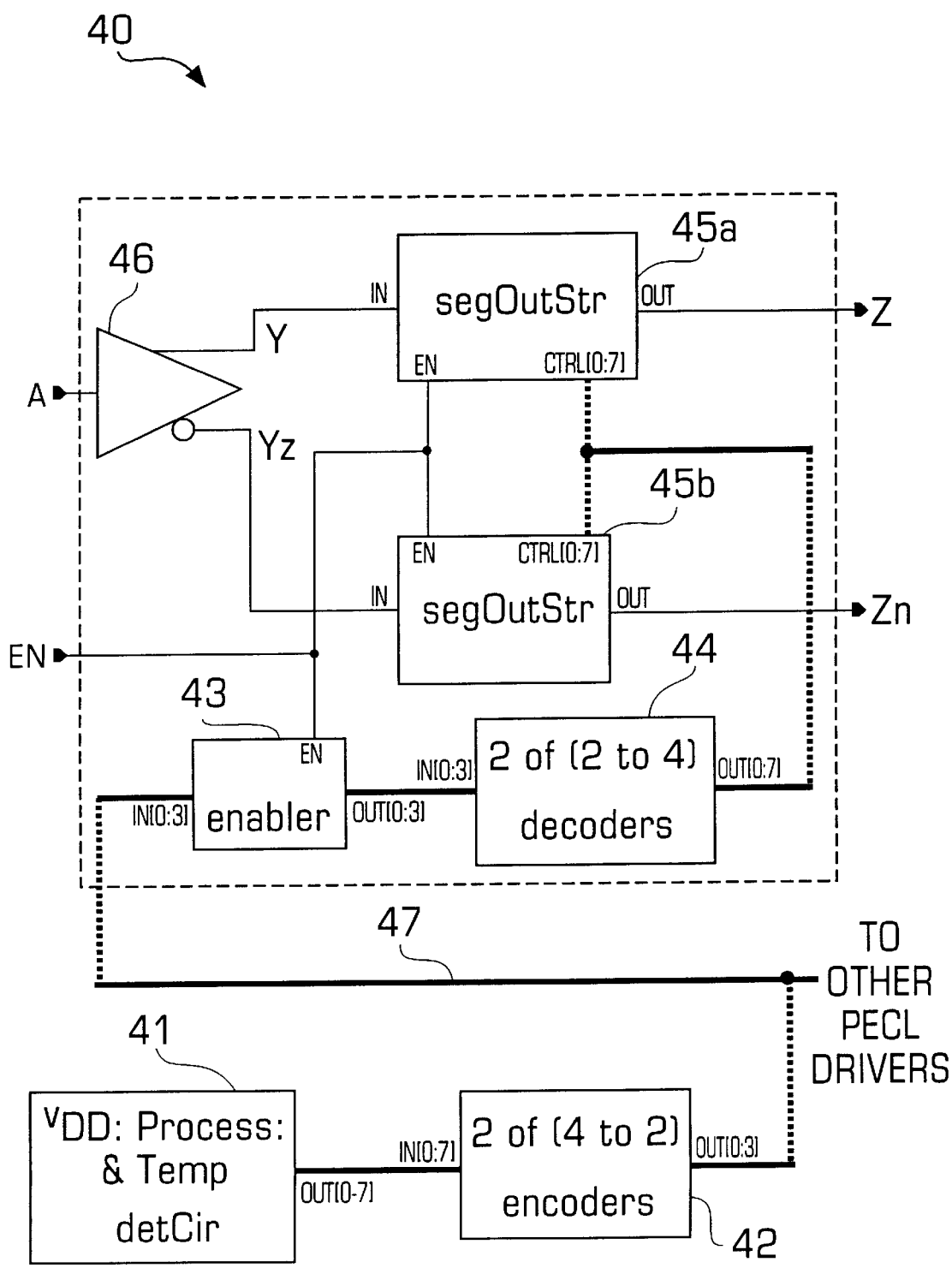
FIG. 4 is a schematic drawing of a CMOS-PECL circuit according to the present invention.

FIG. 4 shows a CMOS-PECL circuit 40 according to the present invention. The circuit 40 of FIG. 4 comprises a detection circuit module 41, an encoder 42, a selection circuit 43, a decoder 44, a plurality of segmented output structure modules 45a,b, and a phase splitter 46. The circuit 40 receives two inputs, signal A and signal EN, and generates two output signals, signal Z and signal ZN.

Briefly, the detection circuit module 41 is connected in series with the encoder 42 through an 8 line bus 47. The encoder 42 has a $2^n$:N encoding ratio, and is shown for representative purposes in FIG. 4 to be two 4:2 encoders, one independently for $V_{DD}$ coding and another for process and temperature coding. However, these digital control lines can be combined into one big 8-bit bus 47, and then encode them by use of a $2^n$:N coding ratio, reducing the number of lines of the 8-bit bus 47 to a 3-bit bus 47.

The encoder 42 is serially connected with the selection circuit 43 which receives, as one of its inputs, the resultant encoded signals from the encoder 42 and is capable of selectively enabling N number of the segmented output structure modules 45a,b. The selection circuit 43 also receives input signal EN which is utilized to selectively enable the N number of segmented structure modules 45a,b.

The decoder 44 is connected in series with the selection circuit 43 through the bus 47. The decoder 44 has an N:$2^n$ decoding ratio, and is shown for representative purposes in FIG. 4 to be two 2:4 decoders, increasing the number of lines of the bus 47 from 4 to 8.

The 8 lines of the bus 47 are received as inputs by each of the segmented output structure modules 45a,b, which also receives, as one of its inputs, signal EN. The segmented output structure modules 45a,b also receive an additional input signal from the output of the phase splitter 46.

The phase splitter 46 receives input signal A, and generates an output signal Y and a complementary output signal YZ. Each segmented output structure module 45 receives complementary signals from the phase splitter 46. For example, segmented output structure module 45a receives input signal Y and segmented output structure module 45b receives complementary input signal YZ.

Each segmented output structure module 45a,b generates complementary output signal Z and signal ZN, in accordance with the input from bus 47. For example, in accordance with the input from bus 47, segmented output structure module 45a will generate output signal Z and in accordance with the input from bus 47, segmented output structure module 45b will generate output signal ZN.

Therefore, by observing the $V_{DD}$ potential and detecting deviations of process and variations of on-chip temperature information via simple low power flash ADCs (characteristic of the comparators of the detection circuit 41) and then converting these signals into digital control signals and encoding/decoding said signals to reduce wire complexity (by means of encoder 42 and decoder 44), these signals can be enabled during non-transmission periods (by way of the selection circuit 43) to discretely select the correct number of segmented output modules 45a,b for driving an output load (not shown).

Figure 5A:
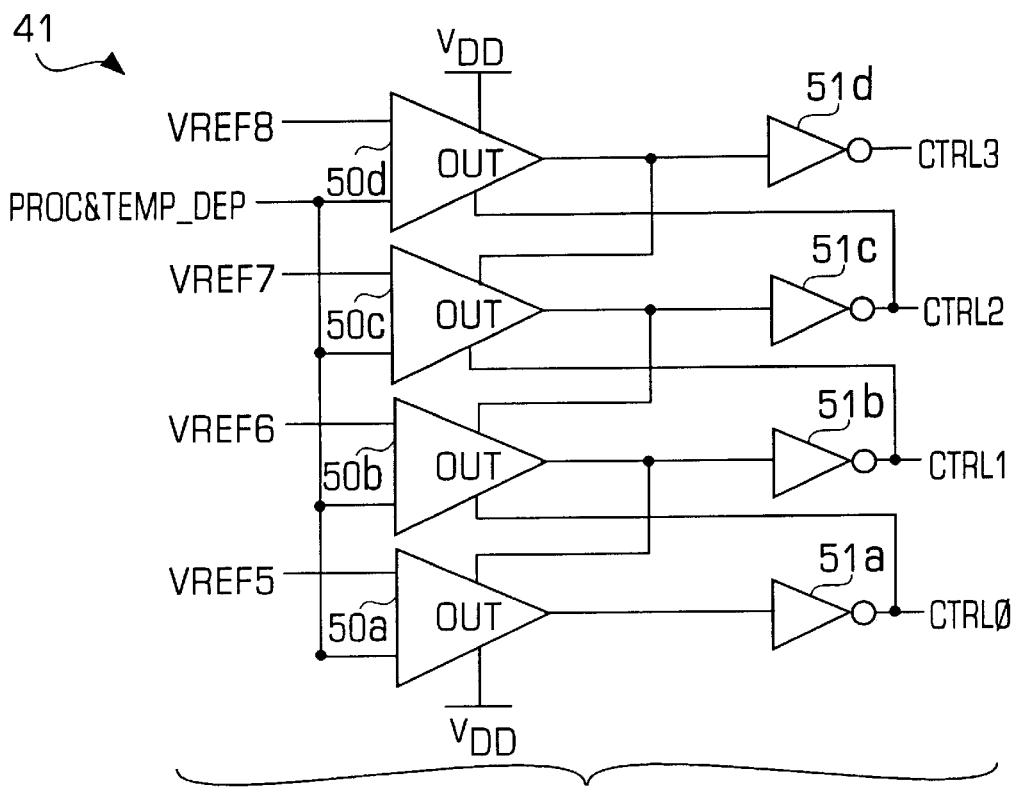
FIG. 5A is a circuit diagram of the detection circuit module for sensing the process-plus-temperature variance for use by the CMOS-PECL circuit of FIG. 4.

FIG. 5A shows a circuit representation of the detection circuit component 41 of FIG. 4 for sensing the process-plus-temperature variance. The circuit 41 of FIG. 5A comprises a plurality of parallel connected comparators 50a–d each connected in series with a respective one of a plurality of inverter buffers 51a–d.

Each of the comparators 50a–d is provided with a respective specific reference voltage input VREF5–VREF8 and a process-plus-temperature signal PROC&TEMP_DEP and generates an output signal OUT.

The output signal OUT of each comparator 50a–d is then propagated through the respective inverter buffer 51a–d which provide respective resultant control signals CTRL0–CTRL3.

Figure 5B:
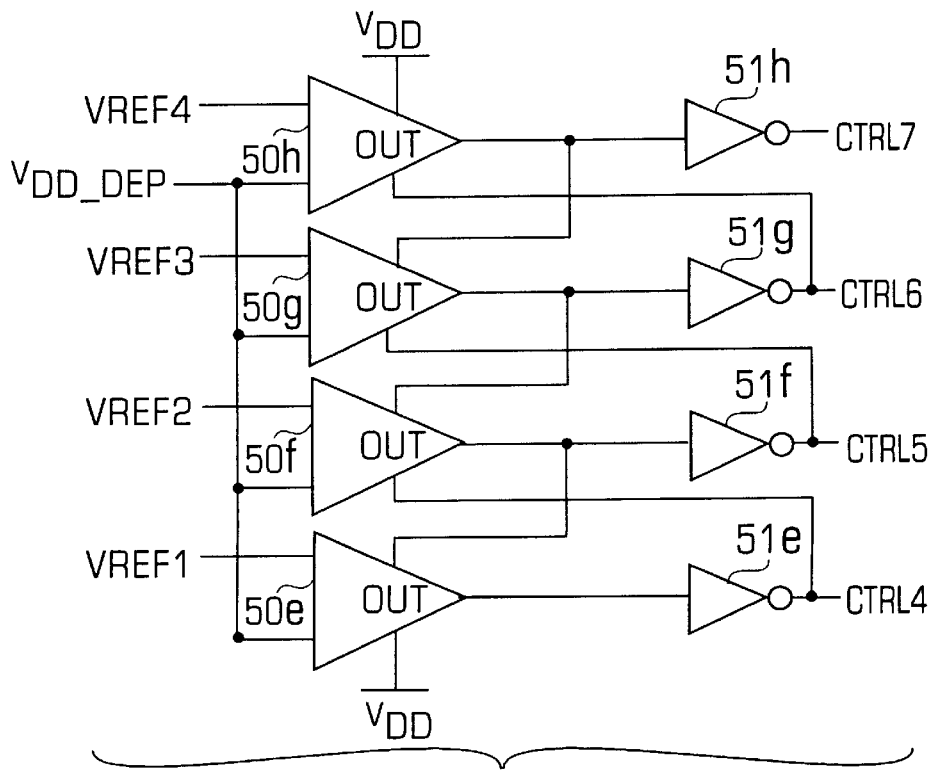
FIG. 5B is a circuit diagram of the detection circuit module for sensing the $V_{DD}$ variance for use by the CMOS-PECL circuit of FIG. 4.

FIG. 5B shows a circuit representation of the detection circuit component 41 of FIG. 4 for sensing the variation of $V_{DD}$. The circuit 41 of FIG. 5B comprises a plurality of parallel connected comparators 50e–h each connected in series with a respective one of a plurality of inverter buffers 51e–h.

Each of the comparators 50e–h is provided with a respective specific reference voltage input VREF1–VREF4 and a $V_{DD}$ dependent signal $V_{DD}$_DEP and generates an output signal OUT.

The output signal OUT of each comparator 50e–h is then propagated through the respective inverter buffer 51e–h which provide respective resultant control signals CTRL4–CTRL7.

Figure 6A:
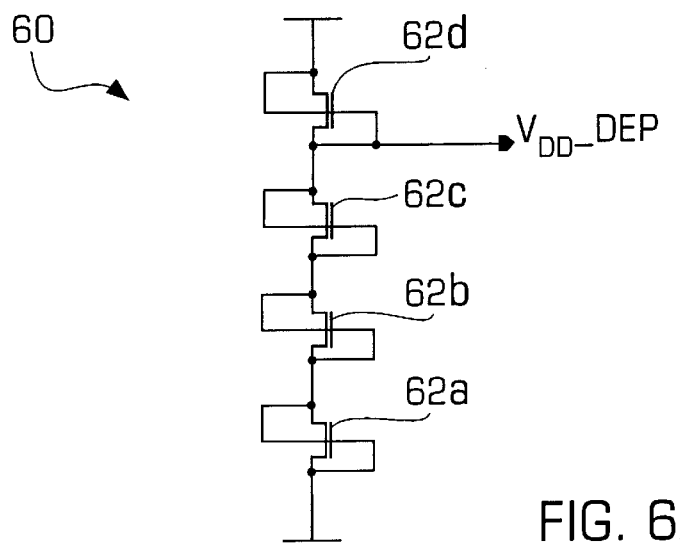
FIG. 6A is a circuit diagram of the $V_{DD}$ dependent signal generator utilized in the detection circuit module of FIGS. 5A and 5B.
Figure 6B:
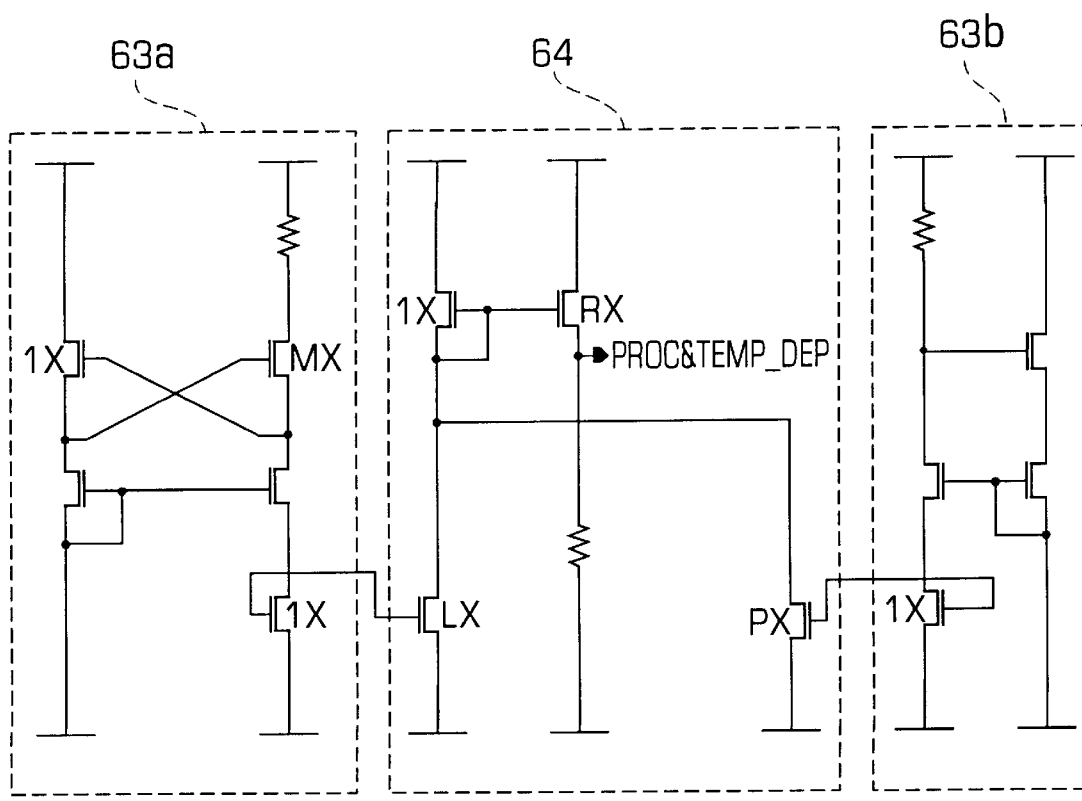
FIG. 6B is a circuit diagram of the process-plus-temperature dependent signal generator utilized in the detection circuit module of FIGS. 5A and 5B.

FIGS. 6A and 6B illustrate the $V_{DD}$ signal generator 60 (FIG. 6A) and process-plus-temperature signal generator 61 (FIG. 6B) utilized by the detection circuit component 41 of FIG. 4.

Referring now to FIG. 6A, the $V_{DD}$ signal generator 60 is comprised of four telescopically connected series field effect transistors (FETs) 62a–d. Each of the transistors 62a–d has its drain terminal connected with its gate terminal, thus behaving as a diode. Further, each successive transistor 62a–d in the telescopic connection has its drain terminal connected with the source terminal of an adjacent transistor 62a–d. For example, the drain terminal of transistor 62d is connected with the source terminal of transistor 62c. Likewise, the drain terminal of transistor 62c is connected with the source terminal of transistor 62b. Also, the drain terminal of transistor 62b is connected with the source terminal of transistor 62a. Each of the source terminal of transistor 62d and the drain terminal of transistor 62a is connected with voltage source $V_{DD}$. The output signal $V_{DD}$_DEP is provided from the source-drain connection between transistors 62c,d.

Referring now to FIG. 6B, the process-plus-temperature signal generator 61 comprises two current sources (referenced as dashed boxes 63a,b) and an amplifier (referenced as dashed box 64). Thus, the PROC&TEMP_DEP signal is generated as the output of amplifier 64.

Figure 7:
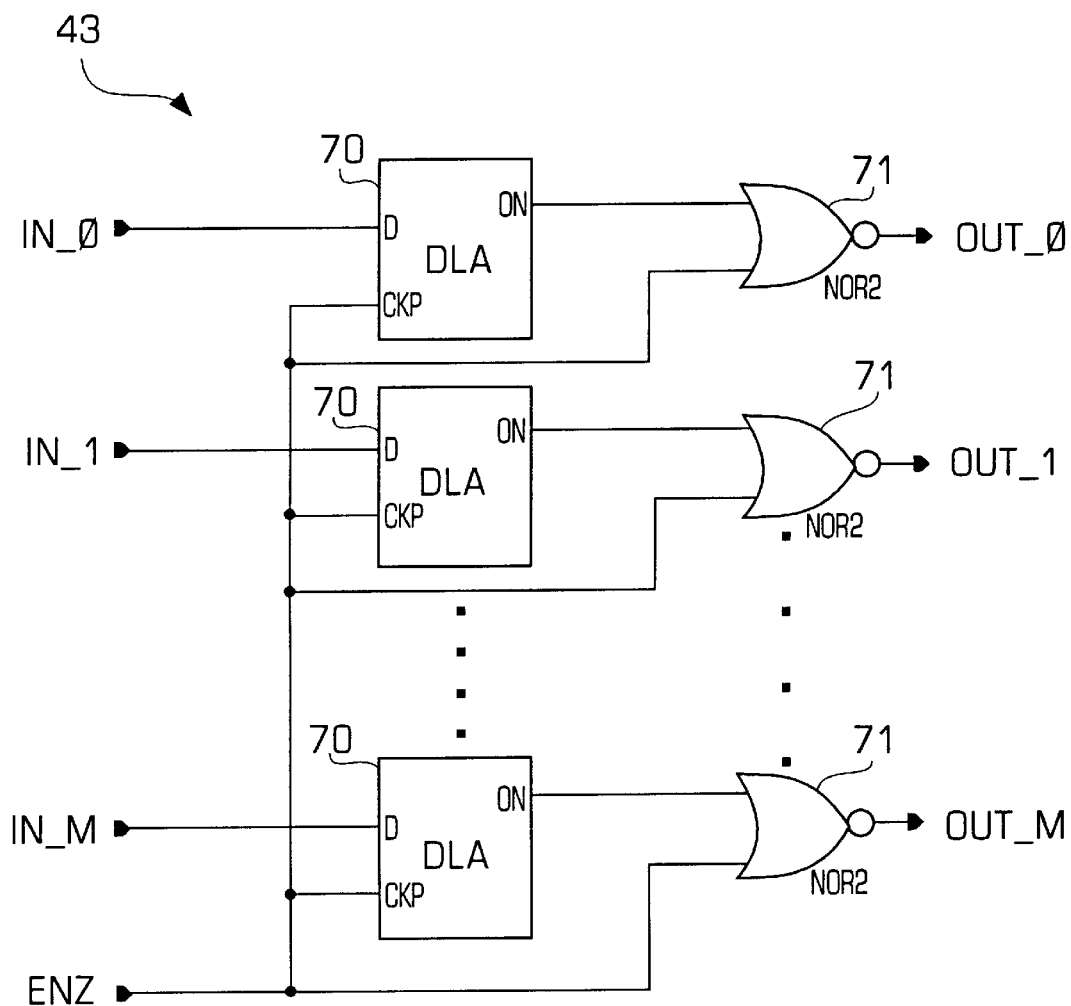
FIG. 7 is a circuit diagram of the selection circuit module of the CMOS-PECL circuit of FIG. 4.

FIG. 7 is a simple schematic diagram of the selection circuit component 43 of the CMOS-PECL driver circuit 40. The selection circuit component 43 comprises a plurality of D-flip-flops 70 connected to a respective plurality of two-input NOR gates 71.

Each D-flip-flop 70 receives an input ENZ, which is an enable signal, and a respective input IN_M (where m is the number of D-flip-flops 70 in the selection circuit 43). Thus, depending upon the input signals ENZ and IN_M, the D-flip-flops 70 generate an output signal QN, which is one of the two inputs to NOR gates 71. Each NOR gate 71 receives, as its other input, the enable signal ENZ. Depending upon these inputs, each NOR gate 71 generates the respective output signals OUT_M (where m is the number of NOR gates 71 in the selection circuit 43). The new control signals are allowed to pass only when the ENZ signal is set LOW (non-transmission state).

Figure 8:
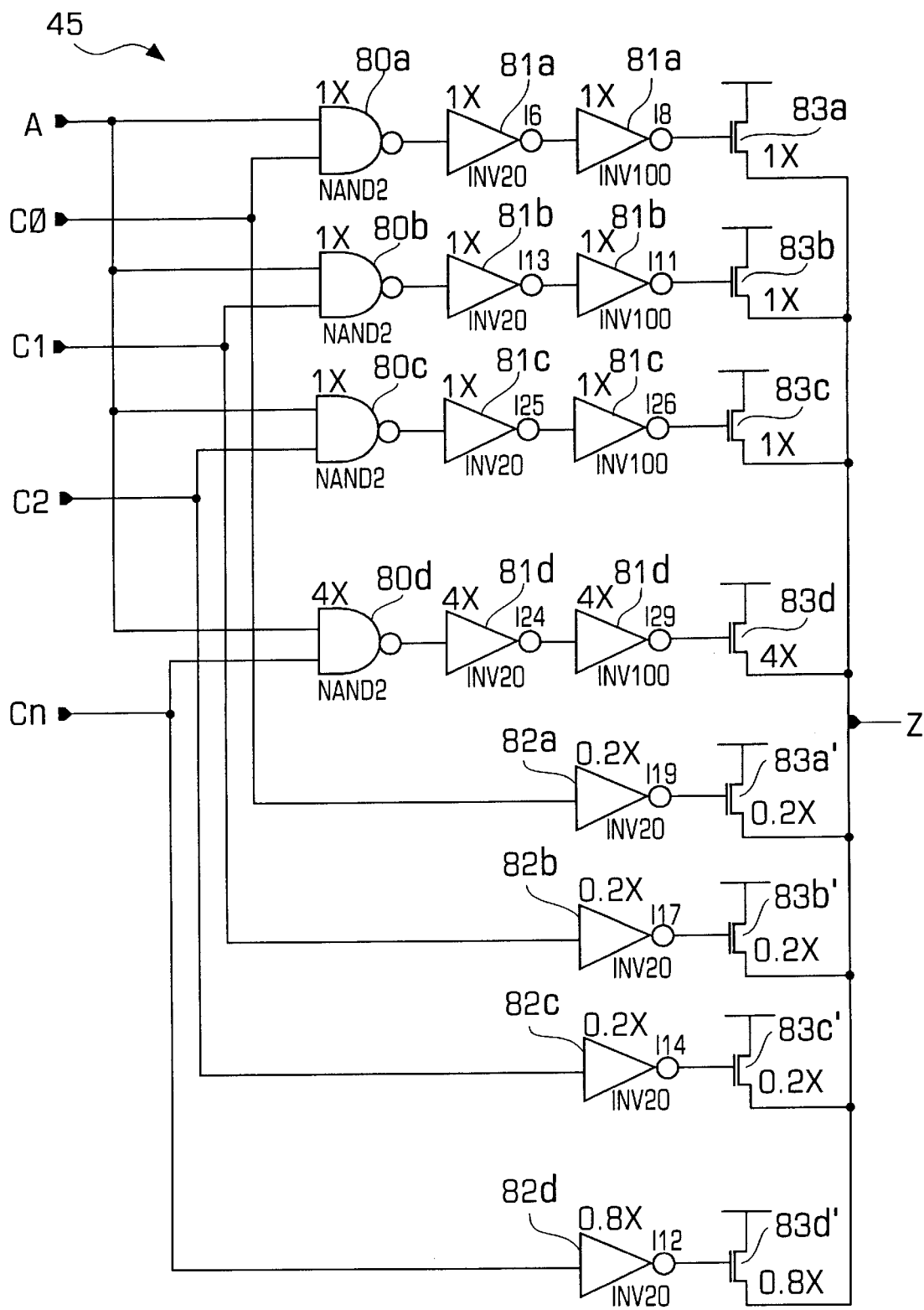
FIG. 8 is a circuit diagram of the segmented output structure characteristic of the segmented output modules of the CMOS-PECL circuit of FIG. 4.

FIG. 8 is a circuit diagram of the segmented output structure component 45 of the CMOS-PECL driver circuit 40. In order to appreciate the segmented output structure 45 of FIG. 8, reference will first be made to FIG. 2, which illustrates the conventional output structure.

Figure 1:
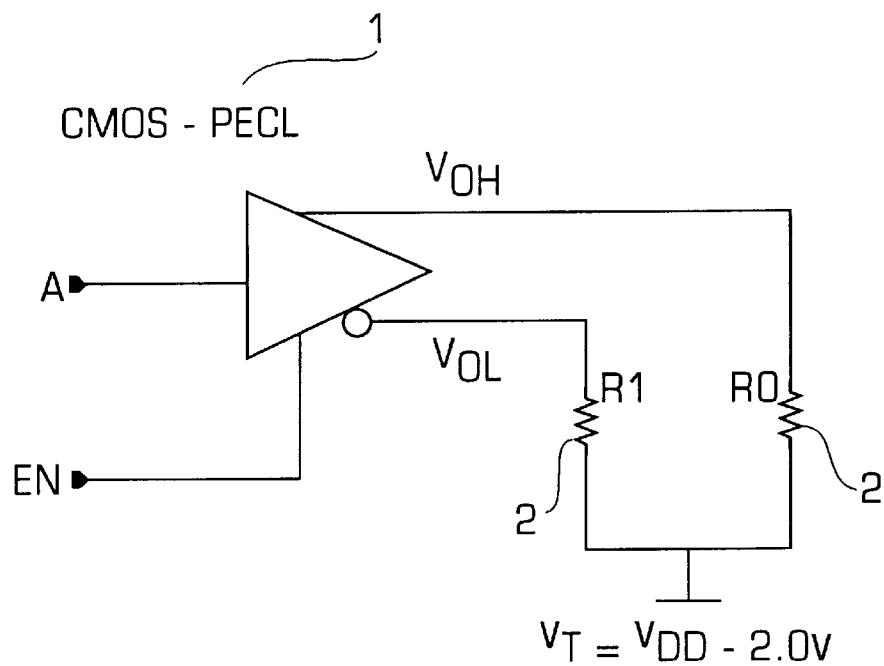
FIG. 1 is a symbol schematic drawing of a conventional CMOS-PECL application circuit.
Figure 2:
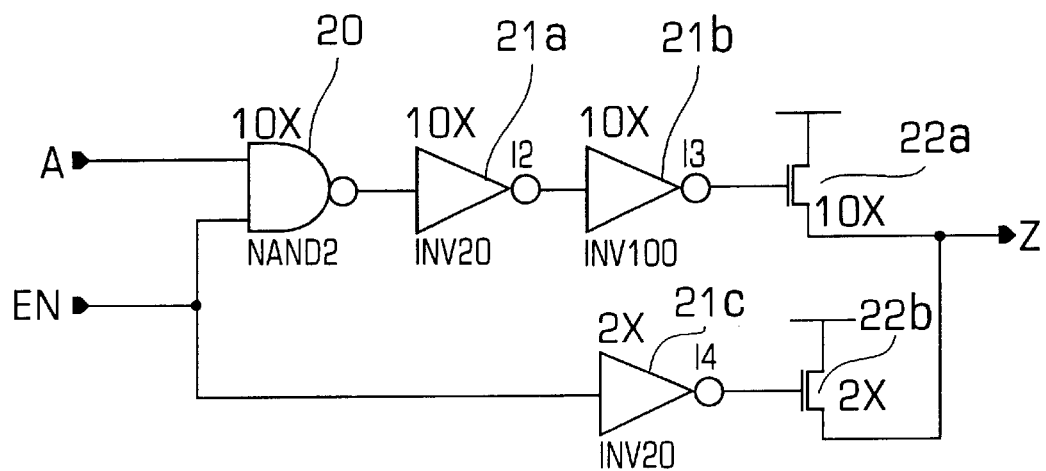
FIG. 2 is a circuit diagram of ½ of the gate-level schematic of a conventional CMOS-PECL driver.
Figure 3:
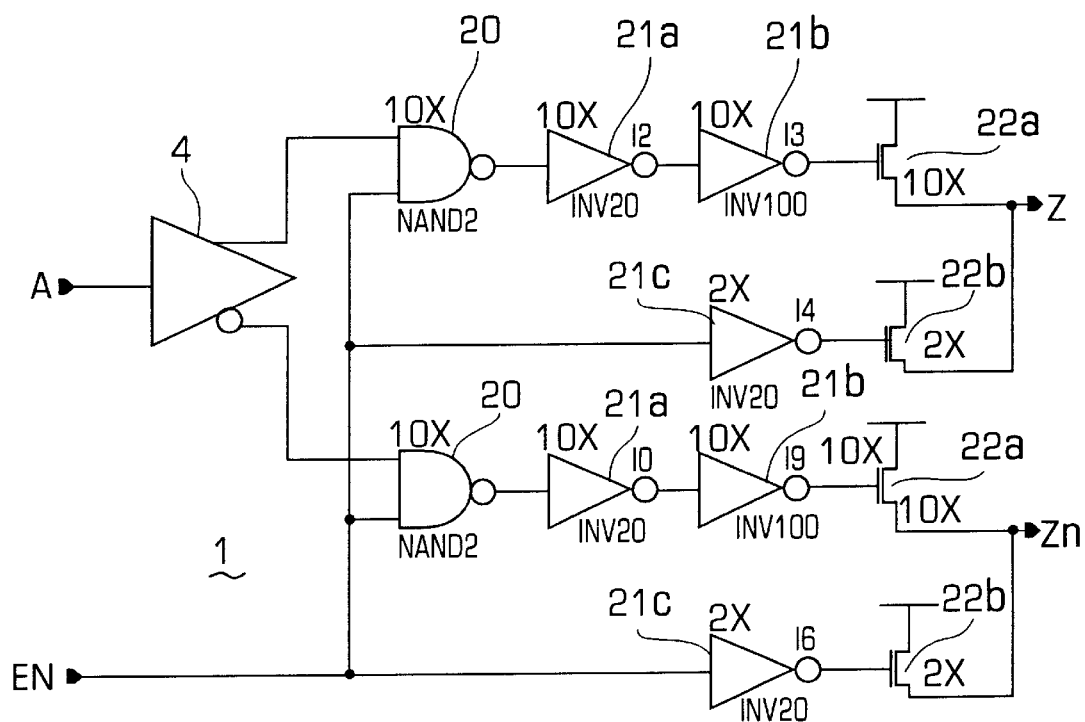
FIG. 3 is a detailed gate-level diagram of the CMOS-PECL application circuit of FIG. 1.

Referring to FIG. 2, the conventional output structure comprises a plurality of NAND gates 20, a plurality of inverters 21a–c, and a plurality of FETs 22a,b. For ease of illustration, only one NAND gate 20, and one of each set of inverters 21a–c are shown. However, as illustrated in FIG. 3, the notations 2X and 10X are there to indicate the relative size of each device that can be referenced to a minimum unit device.

Therefore, in the conventional output structure, a two-input NAND gate 20 receives as its inputs, input signals A and C. NAND gate 20 is connected in series with a first inverter 21a which is connected in series with a second inverter 21b to form a buffer. The output of the second inverter 21b is provided to the gate terminal of FET 22a. The source terminal of FET 22a is connected with voltage source $V_{DD}$.

Inverter 21c receives as its input, signal C. The output of the inverter 21c is provided to the gate terminal of FET 22b. The source terminal of FET 22b is connected with voltage source $V_{DD}$. The drain terminals of FETs 22a,b are connected together, which provide output signal Z.

With the understanding of the conventional output structure, the novel segmented output structure is shown in FIG. 8.

Referring now to FIG. 8, the 1X and 4X notations are placed to indicate the relative size of each device that can be referenced to a minimum unit device. For example, a big structure is naturally comprised of many small segmented structures. Thus, minimum signal degradation is caused by segmenting these units. Thus, the 0.2X and 0.8X references are to help illustrate the segmenting concept described herein.

The segmented output structure component 45 comprises a plurality of two-input NAND gates 80a–d, a plurality of inverter pairs 81a–d, another plurality of inverters 82a–d and a plurality of FET pairs 83a–d,a'–d'. It should be noted that although the description is limited to a certain number of components, in practice, any number of components can be used.

The first of the two-input NAND gates 80a receives as its inputs, input signals A and C0. NAND gate 80a generates an output signal in response to these inputs which is provided through inverter pair 81a to the gate terminal of FET 83a.

Input signal C0 is also provided to inverter 82a which provides its output to the gate terminal of FET 83a'.

Likewise, the second of the two-input NAND gates 80b receives as its inputs, input signals A and C1. NAND gate 80b generates an output signal in response to these inputs which is provided through inverter pair 81b to the gate terminal of FET 83b.

Input signal C1 is also provided to inverter 83b which provides its output to the gate terminal of FET 83b'.

The third of the two-input NAND gates 80c receives as its inputs, input signals A and C2. NAND gate 80c generates an output signal in response to these inputs which is provided through inverter pair 81c to the gate terminal of FET 83c.

Input signal C2 is also provided to inverter 83c which provides its output to the gate terminal of FET 83c'.

Additionally, the nth of the two-input NAND gates 80d receives as its inputs, input signal A and $C_n$ (where n is one less than the number of NAND gates 80 in the segmented structure). Thus, NAND gate 80d generates an output signal in response to these inputs which is provided through inverter pair 81d to the gate terminal of FET 83d.

Input signal $C_n$ is also provided to inverter 83d which provides its output to the gate terminal of FET 83d'.

Each of the source terminals of FETs 83a–d,a'–d' are connected to voltage source $V_{DD}$. Additionally, each of the drain terminals of FETs 83a–d,a'–d' are connected together and provide the output signal Z.

The signals C0–$C_n$ in FIG. 8 also serve as enable signals in this case, since the inverted output signals $Q_n$ of the flip-flops 70 in FIG. 7 are NOR'ed with the enable signal ENZ through NOR gates 71 to provide signals OUT_0–$OUT_m$ to the segmented output circuit 45 in FIG. 8 as respective input signals C0–$C_n$. Thus, NOR gates 71 can be moved from the enabling circuit 43 of FIG. 7 to the segmented output circuit 45 of FIG. 8 without disrupting signals C0–$C_n$.

Figure 9:
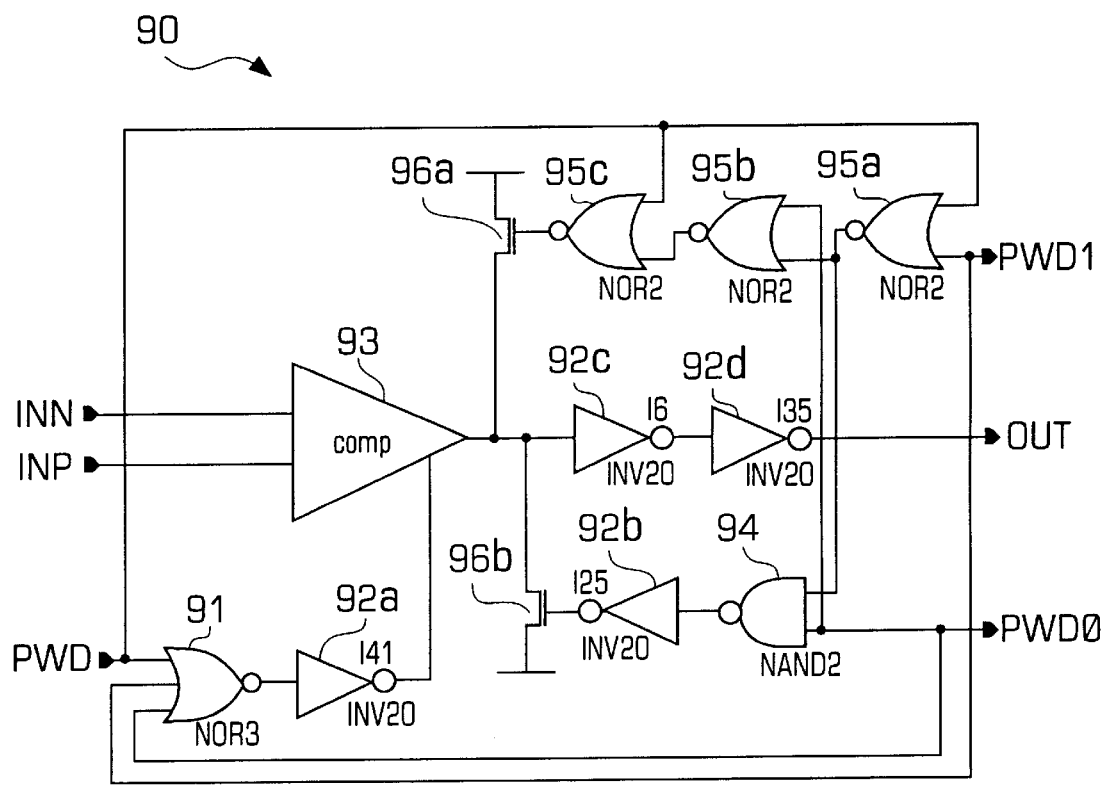
FIG. 9 is a representation of a circuit capable of selectively powering down inactive comparators in the detection circuit module of FIGS. 5A and 5B.

FIG. 9 shows a circuit 90 that is capable of implementing a novel power-saving scheme for powering down the inactive comparators 50 of the detection circuit 41 of the CMOS-PECL driver.

The circuit 90 shown in FIG. 9 comprises a three-input NOR gate 91, a plurality of inverters 92a–d, a comparator 93, a two input NAND gate 94, a plurality of two-input NOR gates 95, and two FETs 96a,b.

The three-input NOR gate 91 receives as its inputs, input signal PWD, signal PWD0 and signal PWD1. In response to these inputs, the NOR gate 91 generates an output which is provided through an inverter 92a to the voltage source terminal of the comparator 93.

The comparator 93 receives as its inputs, input signal INN and INP and generates a resultant output signal OUT. The potential of output signal OUT can be effectively controlled by FETs 96a,b.

For example, the gate terminal of FET 96a receives an input that is dependent from the output of three serially connected two-input NOR gates 95a–c. The first NOR gate 95a receives as its inputs, input signal PWD1 and signal PWD and generates an output, which is received as an input to NOR gate 95b. NOR gate 95b also receives input signal PWD0 and generates an output signal which is received as an input by NOR gate 95c. NOR gate 95c also receives input signal PWD and generates the output signal which is provided to the gate terminal of FET 96a.

Similarly, the gate terminal of FET 96b receives an input that is dependent from the output of the NOR gate-NAND gate-inverter series connection (NOR gate 95a, NAND gate 94 and inverter 92b). NAND gate 94 receives as one of its inputs, the output from NOR gate 95a. The other input received by NAND gate 94 is input signal PWD0. In response to these inputs, NAND gate 94 provides an output through inverter 92b to the gate terminal of FET 96b.

Thus, depending upon the gate terminals of FETs 96a,b, the transistors can be switched on and raise or sink the output signal potential OUT, which is then propagated through a pair of inverters 92c,d.

Thus, if the current active comparator output is sensed as an output logic level HIGH ($V_{OH}$), than the outputs of the comparators having input reference voltages less than that of the input reference voltage of the active comparator will also have an output logic level HIGH ($V_{OH}$). Therefore, the logic level HIGH of the active comparator can be utilized to power down the adjacent comparators that have an input reference voltage at least one unit reference voltage below the reference voltage of the active comparator, and the output can be set to a logic level HIGH. This powering down scheme has a trickle effect which powers down all the comparators having a unit reference voltage at least one unit reference voltage below the reference voltage of the active comparator utilizing the logic shown in FIG. 9.

Likewise, the adjacent comparators that have an input reference voltage greater than that of the reference voltage of the active comparator will have an output logic level LOW ($V_{OL}$). Therefore, the logic level HIGH of the active comparator can be utilized to power down the adjacent comparators that have an input reference voltage at least one unit reference voltage above the reference voltage of the active comparator, and the output can be set to a logic level LOW. This powering down scheme has a trickle effect which powers down all the comparators having a unit reference voltage at least one unit reference voltage above the reference voltage of the active comparator utilizing the logic shown in FIG. 9. As a result, all the comparators in the detection circuit 41 will be effectively powered down utilizing the circuit 90 shown in FIG. 9.

According to the present invention, the detecting circuits 41 are not required to be located next to the PECL driver. Also, changes in the output structure are minimal compared to those of other approaches. As a result, no AC performance degradation will be noticed.

Additionally, due to the digital signal conditions, no switching noise and/or cross talk from nearby switching signals are of concern regarding the control signals which would otherwise be the case using an analog reference bias control approach. In addition, the novel scheme for power saving is designed to address the additional power requirements for sensing circuits.

The foregoing description of the invention has been presented for the purposes of illustration and description. It is not intended to be exhaustive or to limit the invention to the precise form disclosed. Many modifications and variations are possible in light of the above teaching. For example, the invention can be practiced with NFET output structures, or both PFET and NFET output structures. Thus, it is intended that the scope of this invention not be limited by its description, but by its claims which are appended hereto.

What is claimed is:

1. A driver circuit, comprising:
   a detection circuit, configured to sense a plurality of different variable operating condition signals, and in accordance therewith, provide a plurality of operating condition dependent output signals;
   a selection circuit, having a plurality of output signals, configured to receive said plurality of operating condition dependent output signals, and in accordance therewith, provide an N number of enabled signals;
   an output circuit, having a plurality of identical segmented output modules, each of said output modules associated with a respective one of said N number of enabled signals and configured to provide a respective output driving signal, wherein said output modules receive said operating condition dependent output signals; and
   an encoder circuit, configured to receive said plurality of operating condition dependent output signals, and in accordance therewith, perform an encoding process on said plurality of operating condition dependent output signals to yield a reduced ratio of a shared plurality of operating condition dependent output signals; and
   a decoding circuit, configured to receive said reduced ratio of a shared plurality of operating condition dependent output signals, and in accordance therewith, perform a decoding process on said reduced ratio of a shared plurality of operating condition dependent output signals to yield an increased ratio of a plurality of increased output signals.

2. The driver circuit of claim 1, wherein said increased ratio is equal to the inverse of said reduced ratio.

3. The driver circuit of claim 2, wherein said reduced ratio is $2^n$:N and said increased ratio is N:$2^n$.

4. A driver circuit, comprising:
   a detection circuit, configured to sense a plurality of different variable operating conditions, and in accordance therewith, provide a plurality of operating condition dependent output signals;
   an encoder circuit, configured to receive said plurality of operating condition dependent output signals, and in accordance therewith, perform an encoding process on said plurality of operating condition dependent output signals to yield a shared plurality of operating condition dependent output signals;
   a selection circuit, having a plurality of output signals, configured to receive said shared plurality of operating condition dependent output signals, and in accordance therewith, provide a plurality of enabled signals;
   a decoding circuit, configured to receive said plurality of output signals, and in accordance therewith, perform a decoding process on said plurality of output signals to yield a plurality of increased output signals; and
   an output circuit, having a plurality of identical segmented output modules, each of said output modules associated with a respective one of said plurality of enabled signals and configured to provide a respective output driving signal, wherein said output modules receive said plurality of increased output signals.

5. The driver circuit as in claim 4, wherein said plurality of enabled signals are provided during a non-transmission state.

6. The driver circuit of claim 4, wherein said output modules comprises NFET output structures.

7. The driver circuit of claim 4, wherein said output modules comprises both NFET and PFET output structures.

8. A power saving method for a segmented output circuit, comprising the steps of:
   (a) sensing an active circuit element output voltage;
   (b) determining a respective input reference voltage of each adjacent circuit element;
   (c) comparing said respective input reference voltage of each adjacent circuit element with an active circuit element reference voltage;
   (d) selectively powering down each adjacent circuit element of a first group having said respective input reference voltages at least one unit reference voltage less than said active circuit element reference voltage, if said active circuit element output voltage is a HIGH voltage level, and providing a respective output voltage of each of said adjacent circuit elements of said first group equal to said active circuit element output voltage; and (e) selectively powering down each adjacent circuit element of a second group having said respective input reference voltages at least one unit reference voltage greater than said active circuit element reference voltage, if said active circuit element output voltage is a LOW voltage level, and providing a respective output voltage of each of said adjacent circuit elements of said second group equal to said active circuit element output voltage.

9. A method of operating a driver circuit, comprising the steps of:

detecting a plurality of different variable operating conditions and generating a plurality of operating condition dependent output signals in response;

selecting an N number of enabled output signals in response to said plurality of operating condition dependent output signals and providing a plurality of output signals; and providing an output driving signal in response to said enabled output signals and said plurality of output signals.

10. The method of claim 9, further comprising:

encoding said plurality of operating condition dependent output signals to yield a shared plurality of operating condition dependent output signals; and decoding said plurality of output signals to yield a plurality of increased output signals.

* * * * *